United States Patent [19]
Horng

[11] Patent Number: 5,740,017
[45] Date of Patent: Apr. 14, 1998

[54] ENGAGEMENT ASSEMBLY FOR CONNECTING A HEAT DISSIPATION DEVICE TO AN INTEGRATED CIRCUITS

[75] Inventor: Ching-Shen Horng, Kaohsiung, Taiwan

[73] Assignee: Sunonwealth Electric Machine Industry Co., Ltd., Kaohsiung, Taiwan

[21] Appl. No.: 709,868

[22] Filed: Sep. 10, 1996

[51] Int. Cl.[6] ............................................. H05K 7/20
[52] U.S. Cl. ........................... 361/704; 24/458; 24/466; 248/231.31; 248/231.41; 165/80.2; 165/80.3; 165/185; 174/16.3; 257/719; 257/718; 361/707
[58] Field of Search ................................. 361/704, 707; 257/706, 707, 712, 713, 718, 719; 174/16.3; 165/80.2, 80.3, 185; 24/466, 525, 514; 248/229.11, 229.12, 231.31, 231.41

[56] References Cited

U.S. PATENT DOCUMENTS

| | | | |
|---|---|---|---|
| 5,600,540 | 2/1997 | Blomquist | 361/704 |
| 5,664,624 | 9/1997 | Tsai et al. | 361/697 |

Primary Examiner—Leo P. Picard
Assistant Examiner—Boris L. Chervinsky
Attorney, Agent, or Firm—Bacon & Thomas

[57] ABSTRACT

An engagement assembly includes an engaging plate mounted to a holed fin of each of the two outermost opposite rows of fins of a finned plate. Each engaging plate includes at least one first slot defined in a lower portion thereof for releasably engaging with an associated protrusion on a pin seat and a second slot defined in a mediate portion thereof. A press plate is mounted outside each engaging plate and includes an eccentric hole defined therein. A positioning element is extended through the eccentric hole of each press plate, the second slot of the associated engaging plate, and the hole of the associated holed fin. When the press plate is rotated through a pre-determined angle rotated about the positioning element to bear against a lip formed on a top of the associated engaging plate, the engaging plate is moved upwardly such that the first slot of the engaging plate firmly engages with the associated protrusion.

5 Claims, 4 Drawing Sheets

ENGAGEMENT ASSEMBLY FOR CONNECTING A HEAT DISSIPATION DEVICE TO AN INTEGRATED CIRCUITS

BACKGROUND OF THE INVENTION

1. Field of the Invention

The present invention relates to an engagement assembly for connecting a heat dissipation device to an integrated circuit, such as a central processing unit.

2. Description of the Related Art

A wide variety of cooling devices have heretofore been provided, for example, U.S. Pat. No. 5,335,722 to Wu and U.S. Pat. No. 5,287,249 to Chen, both of which disclose fan devices for dissipating heat generated by integrated circuits, e.g., central processing units. These fan devices may only be used on small integrated circuits. Nevertheless, 586 and 686 central processing units have been developed, which are faster and have a larger volume and thus generate more heat. In response thereto, the heat dissipation devices therefor must have a larger volume. Yet, this causes another problem as the conventional engagement method for securing the heat dissipation devices to the central processing units is no longer reliable, i.e., the heat dissipation devices may become disengaged from the central processing units due to vibrations during transportation. The present invention is intended to provide an engagement assembly for connecting a heat dissipation assembly to an integrated circuit which mitigates and/or obviates the above problem.

SUMMARY OF THE INVENTION

The present invention provides an engagement assembly for connecting a heat dissipation device to an integrated circuit mounted to a pin seat. The pin seat has at least one protrusion formed on each of two parallel sides thereof, while the heat dissipation device includes a plurality of spaced fins on an upper side thereof in which each of the two outermost opposite rows of fins includes a holed fin having a hole defined therein.

The engaging assembly comprises an engaging plate mounted to each holed fin. Each engaging plate includes at least one first slot defined in a lower portion thereof for releasably engaging with the associated protrusion on the pin seat and a second slot defined in a mediate portion thereof. Each engaging plate further includes a lip formed at a top thereof. A press plate is mounted outside each engaging plate and includes an eccentric hole defined therein. A positioning element is extended through the eccentric hole of each press plate, the second slot of the associated engaging plate, and the hole of the associated holed fin.

When the press plate is rotated through a pre-determined angle rotated about the positioning element to bear against the lip of the associated engaging plate, the engaging plate is moved upwardly such that the first slot of the engaging plate firmly engages with the associated protrusion.

Preferably, each protrusion has a recess defined in the underside thereof for engaging with the associated engaging plate. The press plate may include a handle formed thereon for performing the rotation thereof. The engaging plate may include two shoulders formed therein, and a gap defined between the holed fin and an adjacent fin may fittingly receive an associated shoulder, thereby allowing smooth vertical movement of the engaging plate. Alternatively, each holed fin may include a groove defined therein for receiving the engaging plate, yet allowing vertical movement of the engaging plate.

Other objects, advantages, and novel features of the invention will become more apparent from the following detailed description when taken in conjunction with the accompanying drawings.

DESCRIPTION OF THE PREFERRED EMBODIMENTS

Figure 1:
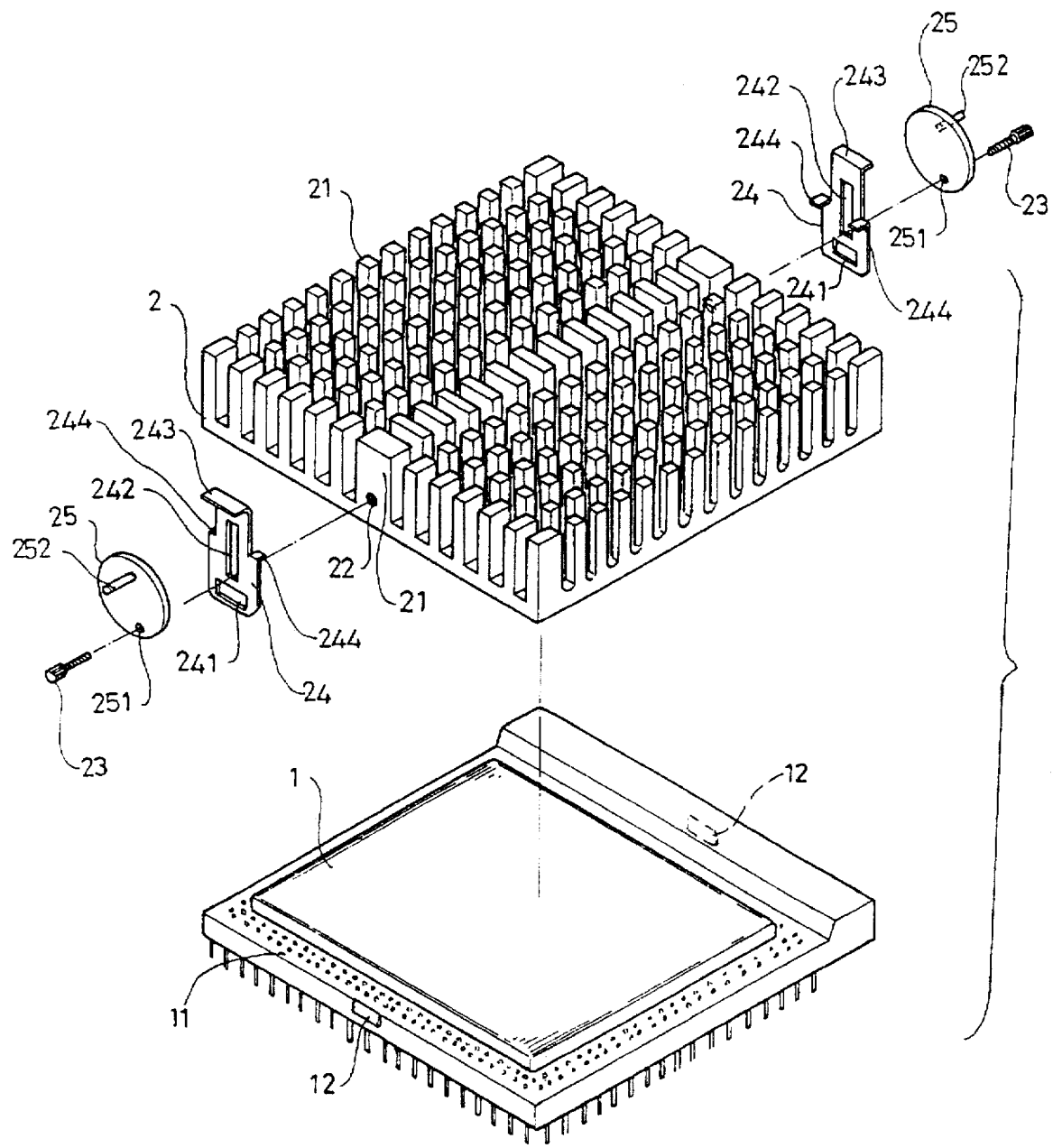
FIG. 1 is an exploded perspective view of an engagement assembly in accordance with the present invention for connecting a heat dissipation device to an integrated circuit.
Figure 2:
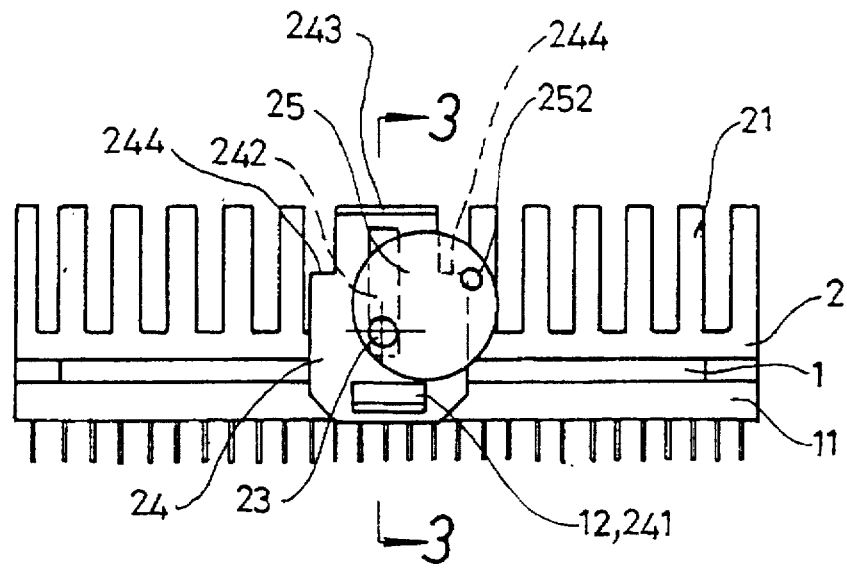
FIG. 2 is a side elevational view of the heat dissipation device connected to the integrated circuit by the engagement assembly of the present invention.
Figure 3:
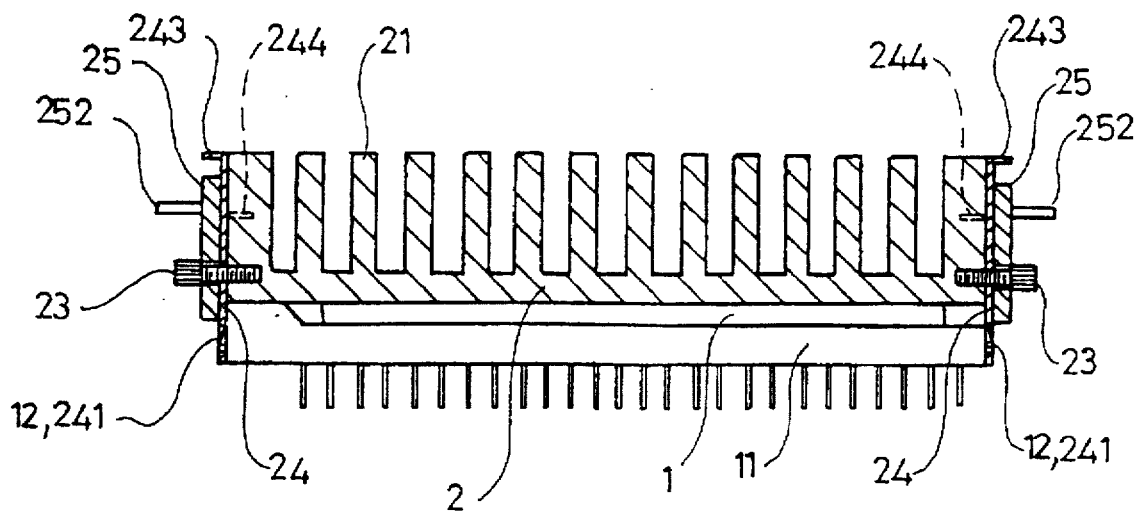
FIG. 3 is a cross-sectional view taken along line 3—3 in FIG. 2.

Referring to the drawings and initially to FIGS. 1 to 3, an engagement assembly in accordance with the present invention is provided for connecting a heat dissipation device (e.g., a finned plate 2) to an integrated circuit (e.g., a central processing unit 1) of a large scale (such as 586 and 686 processors). The central processing unit 1 is mounted to a pin seat 11 which has two protrusions 12 respectively formed on two parallel sides thereof. Preferably, each protrusion 12 may have a flat underside or a recess defined in the underside thereof, which will be described later.

The finned plate 2 is made of materials having excellent heat dissipation characteristics, such as aluminum, copper, etc. The finned plate 2 includes a plurality of spaced fins 21 on an upper side thereof. A fan (not shown) may be engaged to the fins 21 by conventional methods to provide an increased heat dissipation effect. Two holes 22 are respectively defined in the two outermost opposite rows of fins 21 (preferably the middle fin 21), i.e., each of the two outermost opposite rows of fins 21 includes a holed fin 21, which will be explained later.

An engaging plate 24, made of rigid material (e.g., metal), is mounted to each holed fin 21. Each engaging plate 24 includes a first slot 241 defined in a lower portion thereof for releasably engaging with the associated protrusion 12 on the pin seat 11 and a second slot 242 defined in a mediate portion thereof. If necessary, the number of the protrusion 12 and the first slot 241 may be designed to be more than one. Each engaging plate 24 further includes two shoulders 244 formed thereon, while a gap is defined between the holed fin 21 and an adjacent fin for fittingly receiving an associated shoulder 244, thereby allowing smooth vertical movement of the engaging plate 24. Each engaging plate 24 further includes a lip 243 formed at a top thereof.

The engaging assembly of the present invention further includes a press plate 25 which is mounted outside an associated engaging plate 24 and which includes an eccentric hole 251 through which a positioning element (such as a screw 23) extends. The press plate 25 further includes a handle 252 formed on a side thereof.

Figure 4:
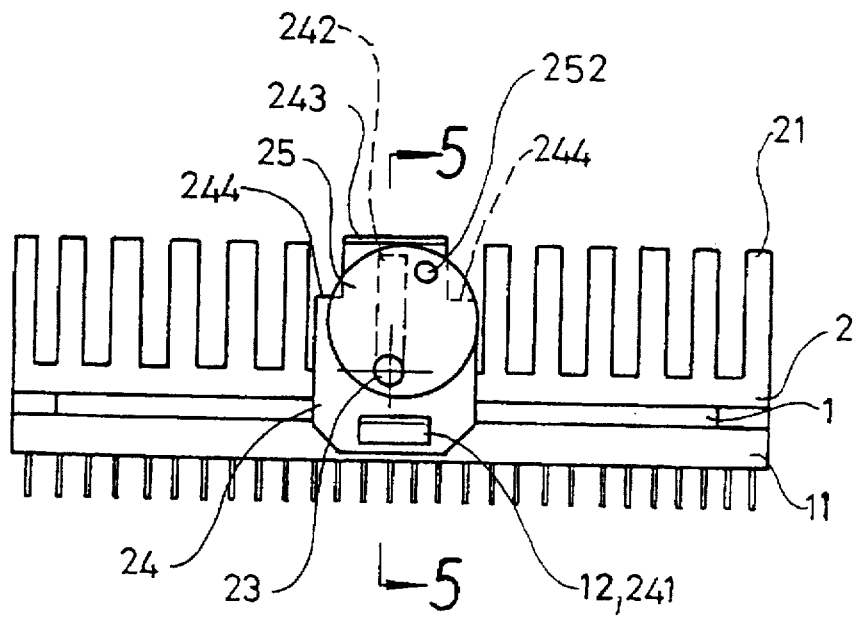
FIG. 4 is a side elevational view similar to FIG. 2, illustrating operation of the engagement assembly.
Figure 5:
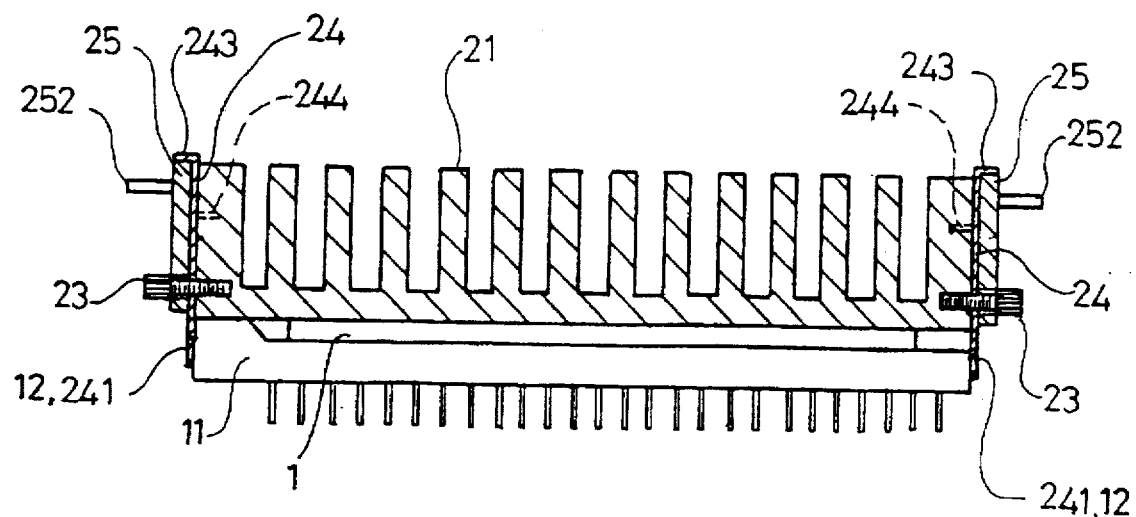
FIG. 5 is a cross-sectional view taken along line 5—5 in FIG. 4.

In assembly, as shown in FIGS. 2 and 3, each screw 23 is extended through the eccentric hole 251 of the associated press plate 25, the second slot 242 of the associated engaging plate 24, and the hole 22 of the associated holed fin 21, while the eccentric hole 251 of each press plate 25 receives the associated protrusion 12 of the pin seat 11. It is to be noted that each press plate 25 does not contact with the lip 243 of the associated engaging plate Referring to FIGS. 4 and 5, when the press plate 25 is rotated through a pre-determined angle by means of holding the handle 252, the press plate 25 is rotated about the screw 23 until it bears against the lip 243 of the associated engaging plate 24. Thus, the engaging plate 24 is moved upwardly such that the first slot 241 firmly engages with the associated protrusion 12. Thereafter, the screw 23 is tightened to complete the assembly.

Figure 6:
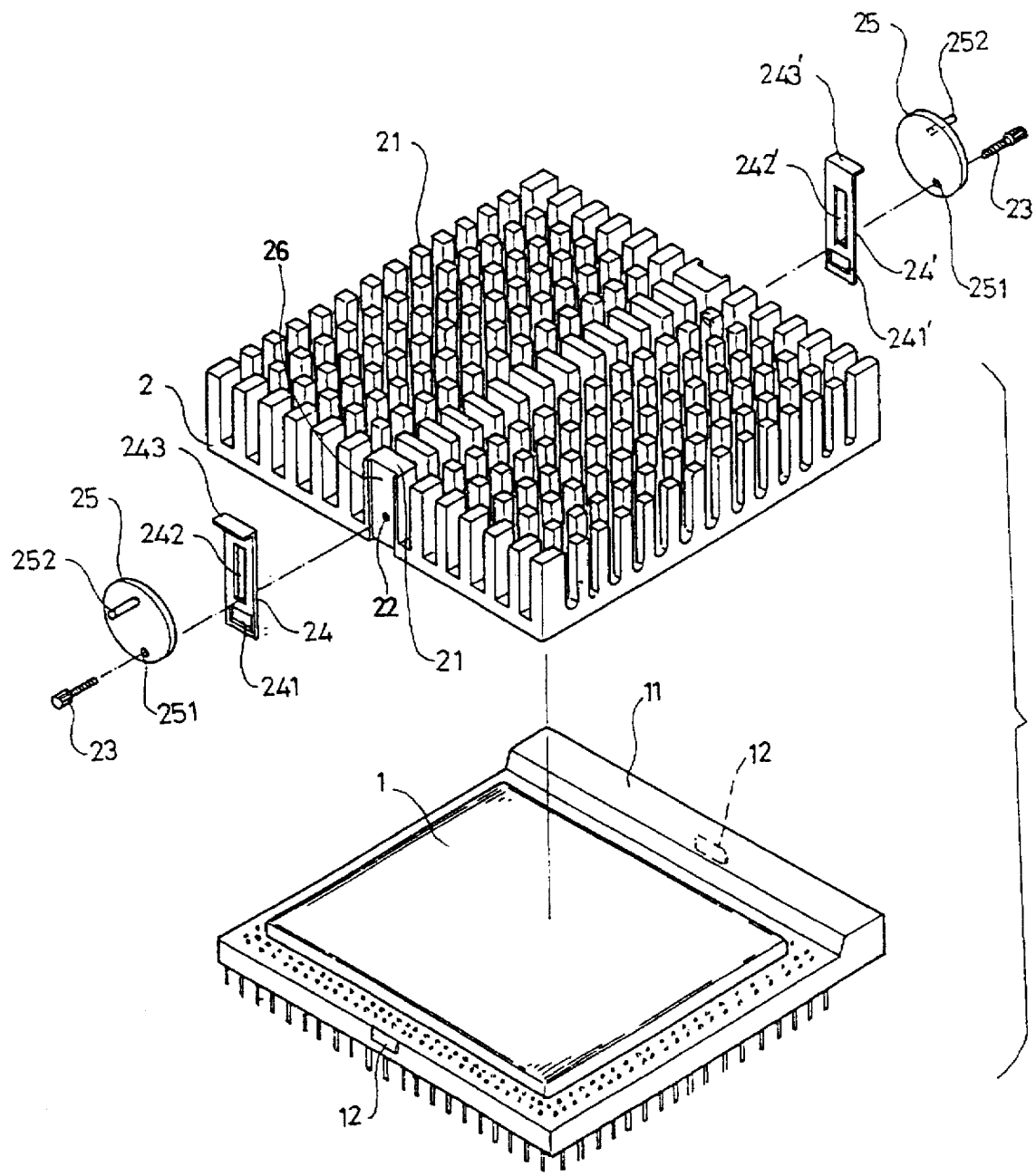
FIG. 6 is an exploded view illustrating a second embodiment of the present invention.

FIG. 6 illustrates an alternative embodiment of the engaging plate 24, wherein the two shoulders 244 in FIG. 1 have been omitted. In addition, each holed fin 21 includes a groove 26 defined therein for receiving the engaging plate yet allowing vertical movement of the engaging plate 24.

Although the invention has been explained in relation to its preferred embodiment, it is to be understood that many other possible modifications and variations can be made without departing from the spirit and scope of the invention as hereinafter claimed.

What is claimed is:

1. An engagement assembly for connecting a heat dissipation device to an integrated circuit mounted to a pin seat, the pin seat having at least one protrusion formed on each of two parallel sides thereof, the heat dissipation device including a plurality of spaced fins on an upper side thereof in which each of the two outermost opposite rows of fins includes a holed fin having a hole defined therein, the engaging assembly comprising:

an engaging plate mounted to each said holed fin, each said engaging plate including at least one first slot defined in a lower portion thereof for releasably engaging with the associated protrusion on the pin seat and a second slot defined in a mediate portion thereof, each said engaging plate further including a lip formed at a top thereof;

a press plate mounted outside each said engaging plate, each said press plate including an eccentric hole defined therein; and a positioning element extended through the eccentric hole of each said press plate, the second slot of the associated engaging plate, and the hole of the associated holed fin;

wherein when the press plate is rotated through a pre-determined angle rotated about the positioning element to bear against the lip of the associated engaging plate, the engaging plate is moved upwardly such that the first slot of the engaging plate firmly engages with the associated protrusion.

2. The engaging assembly according to claim 1, wherein each said protrusion has a recess defined in the underside thereof.

3. The engaging assembly according to claim 1, wherein said engaging plate includes two shoulders formed therein, and wherein a gap is defined between said holed fin and an adjacent said fin for fittingly receiving an associated said shoulder, thereby allowing smooth vertical movement of the engaging plate.

4. The engaging assembly according to claim 1, wherein said press plate includes a handle formed thereon for performing said rotation thereof.

5. The engaging assembly according to claim 1, wherein each said holed fin includes a groove defined therein for receiving the engaging plate, yet allowing vertical movement of the engaging plate.

* * * * *